(12) United States Patent
Lasfargues et al.

(10) Patent No.: US 8,524,514 B2
(45) Date of Patent: Sep. 3, 2013

(54) METHOD FOR PRODUCING A NON-PLANE ELEMENT

(75) Inventors: Gilles Lasfargues, Grenoble (FR); Delphine Dumas, Villate (FR); Manuel Fendler, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 154 days.

(21) Appl. No.: 12/913,492

(22) Filed: Oct. 27, 2010

(65) Prior Publication Data
US 2011/0149423 A1 Jun. 23, 2011

(30) Foreign Application Priority Data
Dec. 22, 2009 (FR) ...................................... 09 59341

(51) Int. Cl.
*H01L 21/00* (2006.01)
(52) U.S. Cl.
USPC 438/26; 438/121; 257/E21.499; 257/E23.004; 257/E31.11
(58) Field of Classification Search
USPC ..... 438/26; 257/436, 443, E31.11; 359/883; 29/25.01
See application file for complete search history.

(56) References Cited

U.S. PATENT DOCUMENTS

| 6,791,072 B1 | 9/2004 | Prabhu | |
| 2009/0026249 A1* | 1/2009 | Kopp et al. | 228/223 |
| 2009/0045510 A1* | 2/2009 | Naya | 257/737 |

FOREIGN PATENT DOCUMENTS

JP 2003188366 A 7/2003

OTHER PUBLICATIONS

Republique Francaise, Rapport De Recherche Peliminaire International Search Report, dated Jul. 14, 2010, 2 pgs.

* cited by examiner

*Primary Examiner* — Charles Garber
*Assistant Examiner* — Abdulfattah Mustapha
(74) *Attorney, Agent, or Firm* — Harris Beach PLLC

(57) ABSTRACT

This method for producing a non-plane comprises fitting a flexible component onto a carrier by means of hybridization columns, each column having a first height and including a volume of solder material formed between two surfaces wettable by said solder material added to the flexible component and to the carrier respectively, said wettable surfaces being surrounded by zones non-wettable by the solder material, the wettable surfaces and the volume of solder material being determined as a function of a second height required for the flexible component relative to the carrier at the place where the column is formed, such that the column varies from the first height to the second height when the volume of material is brought to a temperature higher than or equal to its melting point and heating the volumes of solder material of the columns to a temperature higher than or equal to the melting point of said material in order to melt it.

26 Claims, 4 Drawing Sheets

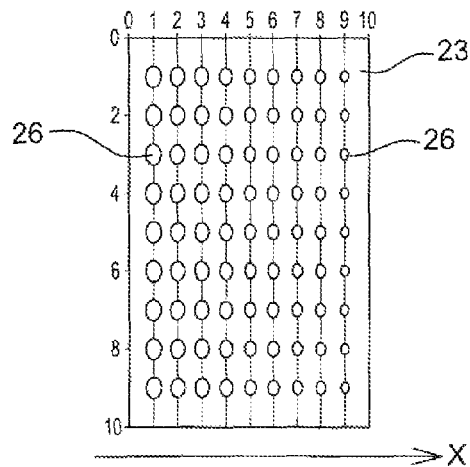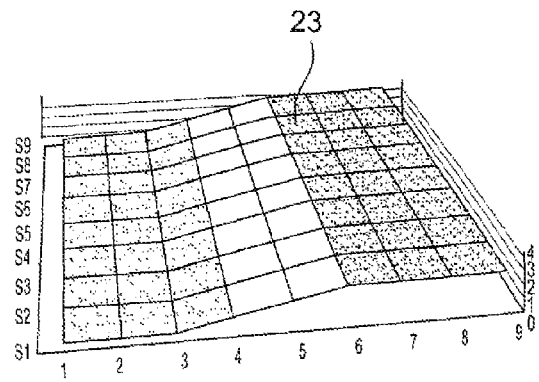
Fig. 12A  Fig. 12B
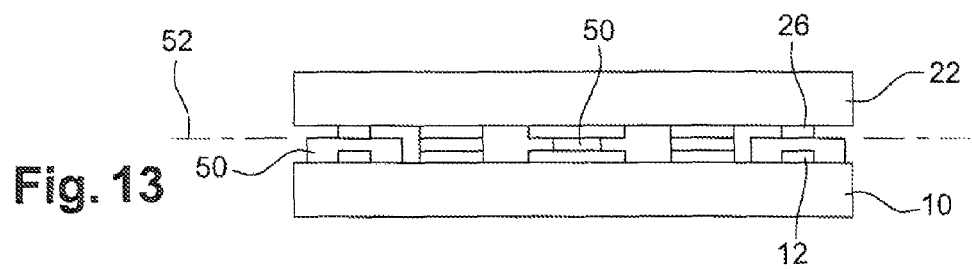
Fig. 13
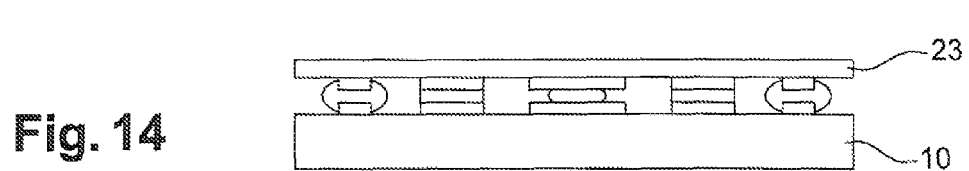
Fig. 14
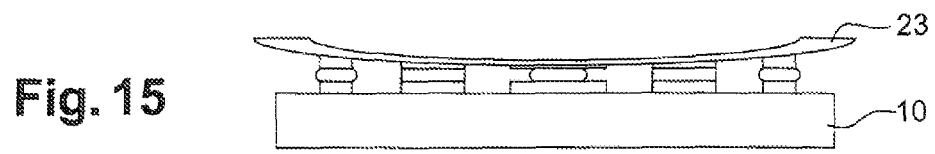
Fig. 15

METHOD FOR PRODUCING A NON-PLANE ELEMENT

CROSS REFERENCE TO RELATED APPLICATIONS

This application claims the benefit of French Patent Application No. 0959341, filed Dec. 22, 2009. The entirety of this application is incorporated herein by reference.

FIELD OF THE INVENTION

The invention relates to the production of non-plane elements and in particular electronic or optical components. It is of particular use in the field of image sensors.

BACKGROUND OF THE INVENTION

Electronic imaging devices commonly include a plane semi-conductive image sensor made of silicon using CMOS or CCD technology, and an optic which forms an image of the scene observed on the image sensor.

However, the use of a straightforward converging lens as an optic is not satisfactory in so far as the image formed by said lens is not plane but spherical, a phenomenon known as "curvature of field". In fact, the image projected by a converging lens on a plane sensor is either sharp at the center but not at the edges or vice versa. This explains in particular why complex optics are produced, consisting of lens clusters that have additionally been subjected to specific surface treatments so that the images they produce conform to the plane nature of the sensor.

However, even at the present time, the most complex optics still introduce a certain number of both geometric and chromatic aberrations, among which can be numbered barrel and pincushion distortions, spherical aberrations (or so-called "diffused light" aberrations), coma, astigmatism, vignetting, glare, stray light (reflection), or chromatic fringes.

Such aberrations need to be corrected, directly upon image formation, through the use of complex and bulky optics, and/or after the event, through the implementation of image processing algorithms that require considerable processing power. The plane nature of the sensors is thus the direct cause of aberrations and the correction thereof involves bulky and expensive lenses and powerful processors built into the cameras and digital photographic appliances.

An effective way of eliminating the errors resulting from the curvature of field is to modify the shape of the image sensor so that it is substantially the same shape as the image formed by the optic. The fact that the sensor is able to be curved therefore means that not only can the aberrations be corrected, but also that cameras and photographic appliances can be designed that are compact and cheap and do not require huge amounts of processing power, accompanied overall by increased visual sharpness of up to 180° for lenses of the "fish-eye" type.

The advantage of designing curved sensors in the image formation field is thus easily conceivable.

Commonly, digital sensors, whatever the technology (CCD or CMOS for visible light, CdHgTe-based for infrared, etc.), and configuration (monolithic, hybridized, etc.) thereof, include a substrate in which a pixel read-out circuit is formed, said substrate having a thickness of between few tens of micrometers and a plurality of millimeters.

In fact, it remains difficult to produce a curved substrate, or more generally to produce a flexible circuit, in respect of thicknesses such as these.

Indeed, curving a plane circuit of significant thickness (typically above 50 micrometers), and therefore of significant rigidity, causes defects that are detrimental to the quality of the circuit, such as for example piping, cracking, tearing, or even the destruction of connections and electrical components contained in the circuit.

To avoid such drawbacks, it is possible to design a circuit that has very low thickness (typically below 50 micrometers for a silicon circuit), and consequently great flexibility, and then to bond it onto a more rigid carrier that has the desired curvature.

However, the adhesive often has uncontrollable and unforeseeable defects (bubbles, defects of homogeneity, etc.) which are transferred to the thinned-down circuit on account of the low thickness thereof. The final quality of the circuit is thus largely random.

Additionally, bonding onto a curved surface is difficult since it is desirable not to put too much pressure on the circuit at the risk of damaging it, and all the more difficult since said surface has a large number of variations. Commonly therefore, bonding is restricted to a plane or slightly convex surface.

SUMMARY OF THE INVENTION

The purpose of the present invention is to propose a method for producing a non-plane element that allows a non-plane, and even complex, surface thereof to be modeled directly on a rigid carrier.

To this end, the object of the invention is the production of a non-plane element, which, according to the invention, includes:

fitting a flexible component on a carrier by means of hybridization columns, each column having a first height and including a volume of solder material formed between two surfaces wettable by said material and surrounded by zones non-wettable thereby, the wettable surfaces and the volume of solder material being determined as a function of a second height required for the flexible component relative to the carrier at the place where the column is formed, such that the column varies from the first height to the second height when the volume of material is brought to a temperature higher than or equal to its melting point; and heating the volumes of solder material of the columns to a temperature higher than or equal to the melting point of said material in order to melt it.

In other words, the so-called "flip-chip" hybridization technology is deflected from its initial use which comprises interconnecting two plane elements to each other.

The flexible component, such as a thinned-down detection circuit for example, rests and is secured on columns including means for adjusting the height thereof, namely the wettable surfaces and the volumes of solder material.

By varying the height of the columns on which the flexible component rests and to which it is soldered, it is then deformed in order to assume the surface profile required by the user. Not only is the flexible component associated, via the columns, directly with a carrier which can be rigid, but additionally, it is possible to create straightforwardly and reproducibly complex non-plane surfaces through an appropriate choice of column height.

"Flexible" component is here taken to mean a component which is capable of being deformed under the action of the variation in column height. In practice, for example, this flexibility results from the thickness of the component, and since it is silicon, this component has a maximum thickness of 50 micrometres.

According to a first embodiment of the invention, the method includes the formation of a thick and rigid component intended to become the flexible component by thinning, and fitting the flexible component on the carrier includes:

forming the wettable surfaces of the carrier and forming the volumes of solder material on said wettable surfaces of the carrier;

forming the wettable surfaces determined for the flexible component on the thick and rigid component;

transferring the thick component onto the carrier to form the hybridization columns;

heating the volumes of solder material to a temperature higher than or equal to the melting point of said volumes, and then cooling them; and producing the flexible component by thinning down the thick and rigid component.

In other words, the flexible component is never handled on its own but always secured to a carrier. The element may therefore be easily handled with no risk of damaging it. No provision therefore needs to be made for special handling devices which are commonly very expensive.

In a second embodiment of the invention, fitting the flexible component on the carrier includes:

forming the wettable surfaces of the carrier and forming the volumes of solder material on said wettable surfaces of the carrier;

forming the wettable surfaces of the flexible component; and transferring the wettable component onto the carrier to form the hybridization columns.

In other words, this embodiment corresponds to the "flip-chip" hybridization technique in its conventional form.

According to one embodiment of the invention, the bumps or wettable surfaces formed on the carrier and the volumes of solder material formed on said bumps form column elements of substantially the same height so as to form a hybridization plane.

This means in particular that a component can be used whereof it is required to model the initially plane surface and that common microelectronics techniques (thinning, surface treatment, etc.) can thus be used.

According to one alternative of the invention, the volumes of solder material are deposited at least partially on the wettable surfaces formed on the carrier in the form of wafers.

In particular, when a hybridization plane is sought, the wafers make it possible to form column elements of substantially the same height directly by deposition and without melting the solder material, and to do so even if the volumes of material are different or the wettable surfaces of the carrier are produced in the form of bumps of different heights and/or areas.

According to the invention, the volumes of solder material are deposited on the wettable surfaces formed on the carrier, heated to a temperature higher than or equal to the melting point thereof so as to form solder beads on the wettable surfaces, and then cooled.

To be more specific, the wettable surfaces of the carrier have substantially the same area and are formed on elements substantially of the same height, and in that the volumes of solder material are substantially identical.

Preferentially, the solder material is indium.

The invention also relates to a non-plane matrix detector and minor produced by means of the aforementioned method.

BRIEF DESCRIPTION OF THE DRAWINGS

The invention will be better understood from reading the following description, offered solely by way of example, and given in relation to the appended drawings, wherein identical reference numbers denote identical or functionally similar elements, and wherein:

FIGS. 12A and 12B are respectively an underneath view of a component to be conformed showing a second example of wettable zones produced and the form of said component once the hybridization column height has been adjusted; and FIGS. 13 to 15 are cross-section views of an element at different stages in a method according to a second embodiment of the invention.

DETAILED DESCRIPTION OF THE INVENTION

A method will now be described according to a first embodiment according to the invention.

Figure 1:
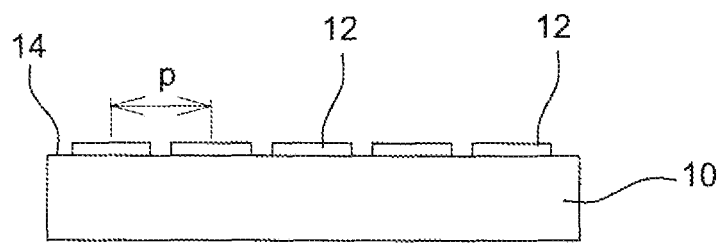
FIGS. 1 to 8 are cross-section views of an element at different stages in the method according to a first embodiment of the invention.

This method starts (FIG. 1) with the formation of a rigid plane carrier 10 comprising a matrix of identical cylindrical bumps 12 spaced apart evenly at a pitch p. The bumps 12 are formed of a material that is wettable in respect of a subsequently deposited solder material, while the surface 14 of the carrier 10 on which they are formed is non-wettable in respect of said solder material.

Figure 2:
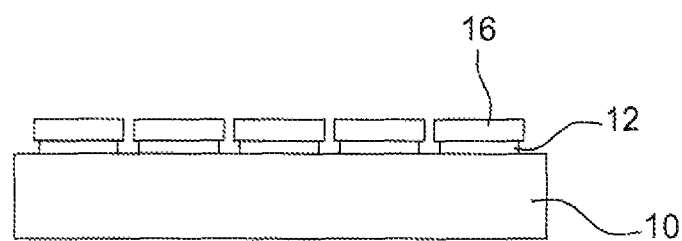

The method continues (FIG. 2) with the deposition of cylindrical and identical wafers of solder material 16 on the bumps 12.

Figure 3:
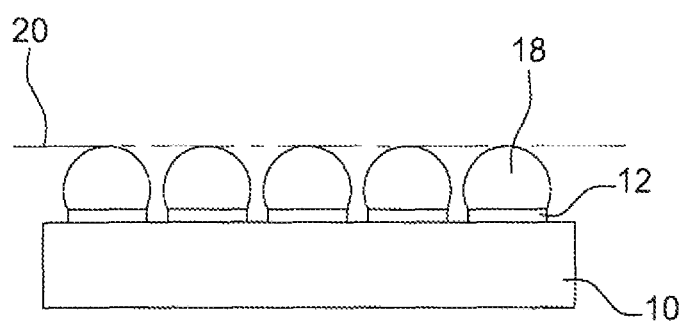
Figure 4:
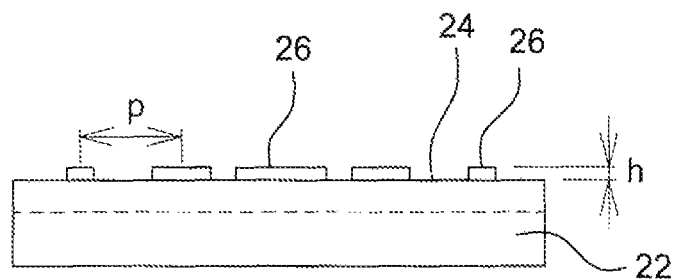

The assembly is then brought to a temperature higher than or equal to the melting point of the material of the wafers 16 in order to melt it. On account of the non-wettability of the solder material with the surface 14 and of the wettability of the solder material with the bumps 12, the solder material wets the surface of the bumps 12 taking the form of truncated spheres 18, commonly denoted by the expression "solder beads" (FIG. 3). The heating is then stopped and the solder beads 18 solidify as they fuse with the bumps 12.

Since the bumps 12 are identical and the volume V of solder material is identical for the solder beads 18, the tops thereof are arranged in a single plane 20, known as the "hybridization plane".

Next, or at the same time as the aforementioned stages, a thick and rigid plane component 22 is provided, on a surface 24 non-wettable by the material of the solder beads 18, with cylindrical bumps 26 of a material wettable by the solder material. The bumps 26 have an identical height h and are formed according to the same distribution pattern as the bumps 12 on the carrier 10. Consequently the bumps 26 are spaced apart evenly at the pitch p in the example shown. The area of each bump 26 is for its part chosen as a function of a desired height, as will be explained in further detail below.

Figure 5:
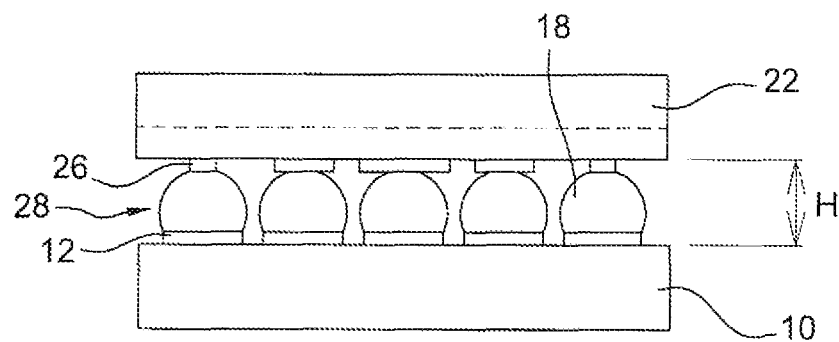

The component 22 is then turned over and placed on the solder beads 18 with the bumps 26 positioned thereon (FIG. 5). Hybridization columns 28 are thus obtained each including a solder bead 18 sandwiched between a bump 12 of the carrier 10 and a bump 26 of the component 22. In the example shown, on account of the particular choice of the heights of the bumps 12, 26 and of the volume of identical material V, the hybridization columns 28 are of identical height H.

The assembly is then brought to a temperature higher than the melting point of the material of the solder beads 18 in order to melt same, no pressure being applied furthermore to the component 22. The liquid phase solder material then wets the bumps 26 of the component 22.

Since the carrier 10 and the component 22 are rigid, the solder beads 18 will either stretch out, or be compressed as a function of the area of the bumps 12 and 26.

Figure 9:
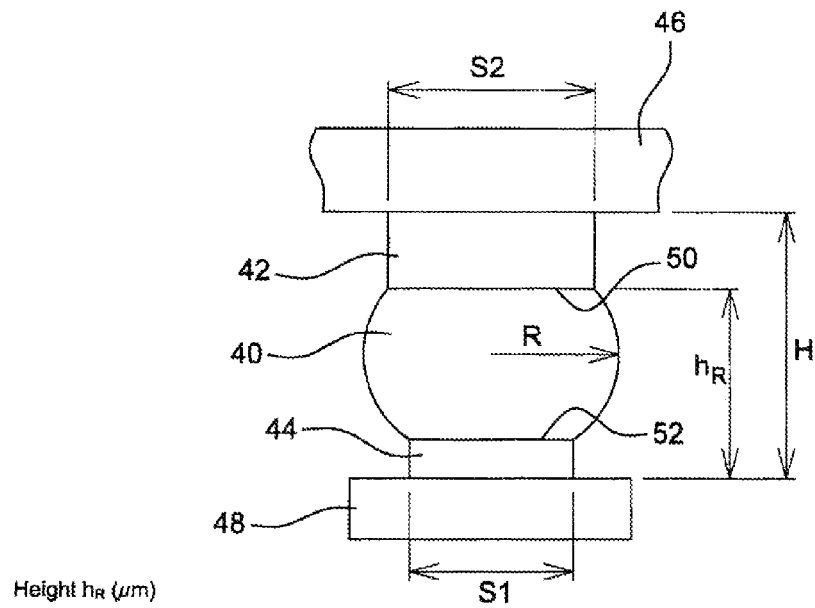
FIG. 9 is a more detailed cross-section view of a hybridization column showing the founding physical principle of the invention.

FIG. 9 shows this phenomenon, as well as the principle underlying the present invention. Considered here is a single liquid solder bead 40 sandwiched between two cylindrical bumps 42, 44 of a material wettable by the material of the bead 40 and formed on components 46, 48 respectively the surface of which is non-wettable by the material of the bead 40.

If the height H between the components 46 and 48 is free to vary as a function of the properties of the bead 40 (for example, the component 48 is fixed and the component 46 is placed on the bead 40 with no further external constraints), when the material of the bead 40 is in liquid phase, it then assumes a unique equilibrium form depending on the nature of the constituent material thereof, on its compression strength (which determines the minimum height of the bead 40 at maximum crushing strength), on its maximum tensile strength (which determines the maximum height of the bead 40 at maximum stretching strength) and on external parameters such as the pressure applied by the surfaces with which it is in contact (in the example shown, the surface pressure applied by the bump 42 given the weight of the bumps 42 and the weight of the component 46).

It will also be noted that it is of no great importance for the bumps 42, 44 to be initially positioned exactly opposite one another. Indeed, during the fusion of the bead 40, the fastening of the material thereof to the wettable surfaces of the bumps 42, 44 naturally causes the relative movement of the components 46, 48 so that they reach a state of equilibrium wherein the bumps 42, 44, and therefore the components 46, 48, are aligned.

In practical terms, this means that it is possible to position the bumps 26 roughly on the beads 18 at the stage described in FIG. 5, the subsequent fusion of the beads 18 causing the component 22 to align itself on the carrier 10.

In practice again, if the pressure due to the weight of the bump 42 and of the component 46 is negligible (as is the case with microelectronic circuits which rest on a multitude of hybridization columns), the equilibrium form of the bead 40 is approximated by a truncated sphere via the surfaces 50, 52. This truncated sphere has an equilibrium height hR that can be easily calculated by straightforward geometric calculation rules as a function of the volume of material of the bead 40 and of the area S1, S2 of the surfaces 50, 52 of the bumps 42, 44. In particular, it will be noted that the larger the sum of the areas S1, S2, the smaller the equilibrium height Hr.

If on the other hand the height H between the components 46 and 48 is constrained in any way whatsoever, the bead 40 is stretched if this height H is greater than the equilibrium height hR or is compressed if this height H is less than the equilibrium height hR.

Figure 6:
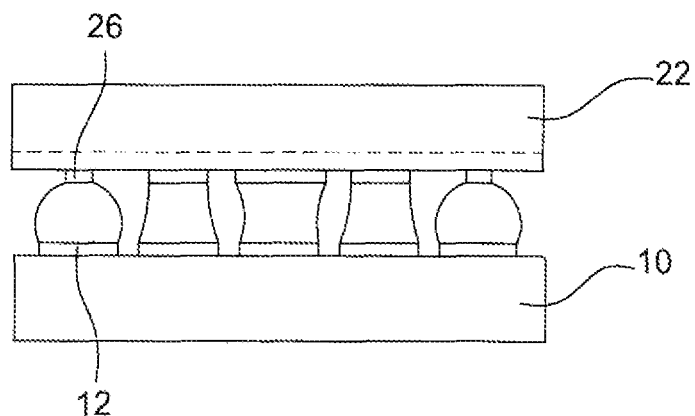

Further reference to FIG. 6 will make it clear that the beads 18 in contact with bumps 12, 26 of large wettable surface will draw the component 22 towards the carrier 10. This coming together is however blocked by the beads 18 in contact with bumps 12, 26 of small wettable surface since these beads reach their maximum compression strength. Since the component 22 is rigid, and therefore non deformable, it thereby imposes on the beads 18 in liquid form a stretched or compressed form as a function of the surface of the bumps 12, 26 which determine the equilibrium heights of the beads 18. A state of equilibrium is then obtained for the assembly.

The heating is stopped so as to make the beads 18 solid, the component 22 thus being soldered to the carrier 10 via the hybridization columns 28. It will be understood that this state is intermediate and that the form of the solder beads, stretched or compressed, and the height separating the component 22 from the carrier 10 are of little importance at this stage in the method, the essential thing being to obtain a rigid assembly capable of being subjected to conventional techniques in the field, and in particular thinning and/or surface treatment techniques.

Figure 7:
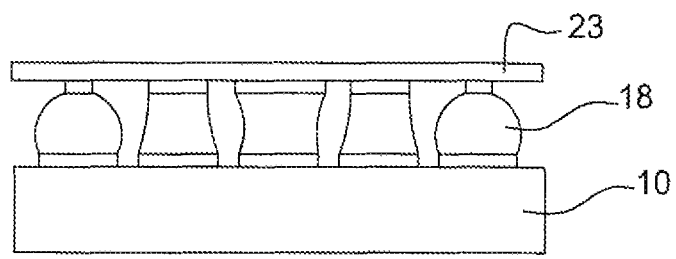

Once the solder beads 18 have solidified, the method continues (FIG. 7) by thinning down the component 22 in order to confer a flexible nature thereon, i.e. sufficiently deformable to allow the beads 18 to assume their equilibrium form once in the liquid state. For example mechanical grinding or polishing is used. A flexible component 23 is thus obtained. For example a silicon component thinned down to give a thickness of less than 50 micrometers may see its height vary by more than 20% without significant deterioration.

Figure 8:
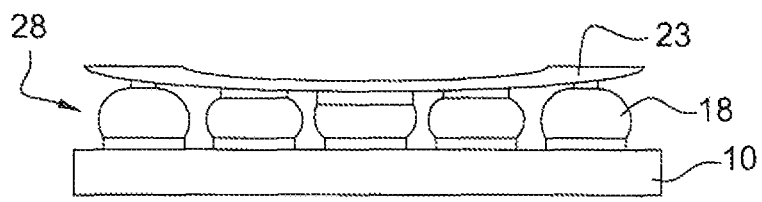

Once the flexible component 23 is formed by thinning down, the assembly is once more heated to a temperature higher than or equal to the melting point of the material of the solder beads 18 (FIG. 8). Since the component 23 is flexible, it then allows the solder beads 18 to assume their equilibrium form. The component 23 is then deformed in accordance with the heights of the hybridization columns 28, themselves determined by the equilibrium heights hR of the beads 18.

The heating is then stopped in order to solidify the solder beads 18 in their equilibrium form. A component 23 is thus obtained that has a non-plane surface modeled by the hybridization columns 28 of different heights and secured by soldering to a rigid carrier.

Figure 10:
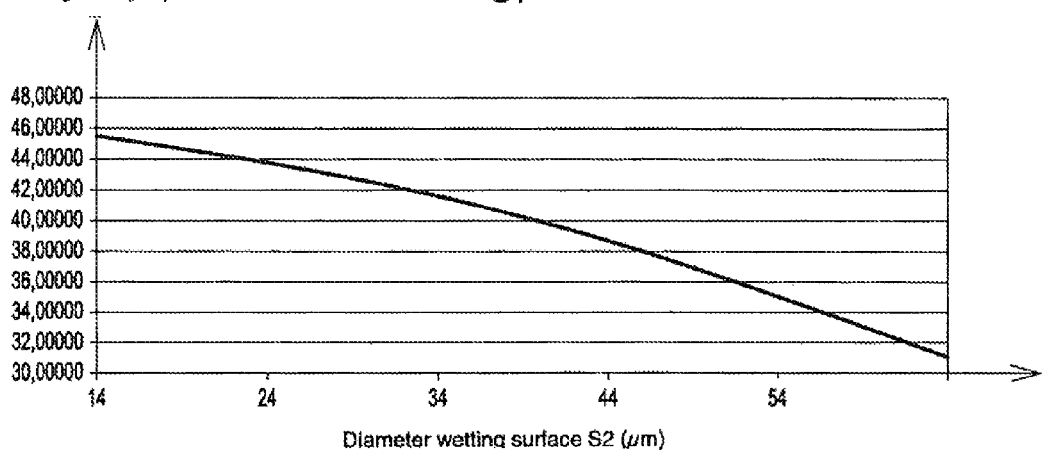
FIG. 10 is a plotting line showing the height of a hybridization column as a function of the diameter of a wettable zone.

The plotting line in FIG. 10 shows the equilibrium height of the solder beads 18 in respect of bumps 12 of the carrier 10 of diameter equal to 45.17 micrometers (i.e. an area S1 of 1.602.103 $\mu m^2$) and a volume of material of the beads 18 equal to 86.023.103 μm3. The x-coordinates show the diameter of the bumps 26 formed on the component 23 and the y-coordinates the corresponding equilibrium height hR of the beads 18.

As can be seen, it is possible to obtain through an appropriate choice of the diameter of the bumps 26, and therefore of the area of the wettable surface defined by the bumps 26, a variation of 60% in the equilibrium height of the beads 18, which is sufficient to model a silicon component 22 of a thickness of less than 50 micrometers that is able to sustain a variation of 20% in its height without deterioration.

Figures 11A, 11B:
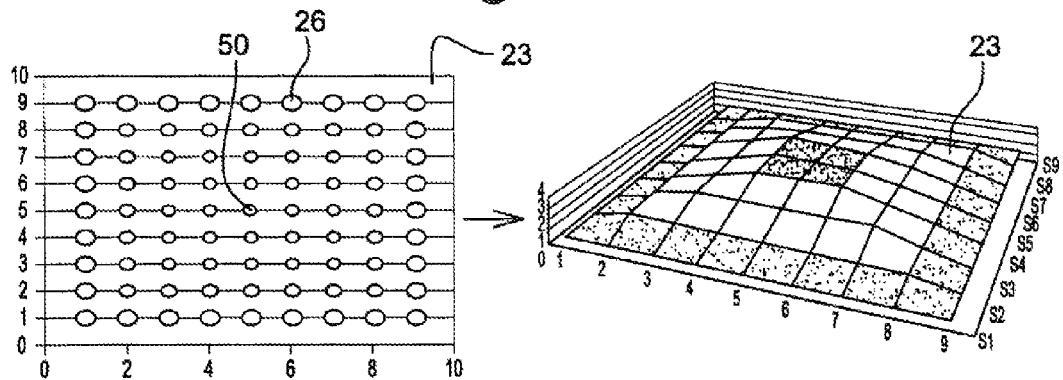
FIGS. 11A and 11B are respectively an underneath view of a component to be conformed showing a first example of wettable zones produced and the form of said component once the hybridization column height has been adjusted.

FIG. 11A shows an underneath view of the component 23 with a first example of bumps 26. The bumps 26, and therefore the surfaces wettable by the beads 18, here have an area that grows as a function of the distance to a central bump 50. A convex surface is thus obtained for the flexible component 23 as shown in FIG. 11B. Said convex, and in particular spherical, surface is particularly suitable for matrix detectors as has been described previously.

FIG. 12A shows an underneath view of the component 23 with a second example of bumps 26 whereof the area decreases along an axis X. A surface is thus obtained with inclined portions for the flexible component 23, as shown in FIG. 12B. If the area of the bumps 26 decreases constantly along the axis X, a plane surface inclined relative to the carrier 10 is then obtained. An inclined surface is suitable for example for micro-mirrors Such micro-mirrors are particularly advantageous for reflecting laser beams at a controlled angle.

The material of the solder beads 18 is chosen preferentially from metals and alloys with a low melting point so as not to damage the carrier 10 and the component 23 during heating operations, and in particular tin, indium and lead and alloys based thereon.

Indium is preferentially used for its low melting point of 156.6° C. The bumps 12, 26, or a surface layer thereof, are then constituted by gold and the non-wettable surfaces surrounding the bumps 12, 26 are constituted by an insulating material such as silica or a polyimide. For example, the carrier is constituted by such a material or includes a surface layer constituted by such a material.

A method has been described wherein the thick and rigid component 22 is hybridized on the carrier 10 by means of hybridization columns, which in particular means that no flexible component has to be handled on its own and no provision therefore needs to be made for specific handling devices.

As an alternative, the flexible component 23 is directly hybridized on the carrier 10. In such a case, one single heating stage is sufficient to model the surface of the component. The advantage of this embodiment is that it enables the maximum accessible deformation to be increased with indium beads by choosing, if the need arises, different wettable surfaces for the carrier and different volumes of material. There are thus three degrees of freedom for adjusting the equilibrium height of the solder beads.

A method has also been described wherein the bumps 12 of the carrier 10 have a surface of identical wettability, the height of the hybridization columns 18 being adjusted by the area of the surfaces of the bumps 26 of the component 23. This makes it possible in particular, when the volume of the solder beads 18 is identical, to obtain a hybridization plane, which facilitates the method in so far as conventionally used devices operate with parallel planes. However, this limits the variability in the height of the solder beads 18 and therefore of the hybridization columns 28.

As an alternative, the bumps 12 of the carrier 10 also have different wettability surfaces. The range of possible heights for the solder beads 18 is thus extended Likewise, the volume of material for the solder beads 18 may be different from one bead to another in order to increase said range. Likewise the heights of the bumps 12 on the carrier 10 and/or the heights of the bumps 26 on the component 23 may be chosen to be different in order to extend the range of possible heights for the hybridization columns 28. Likewise, the wettability surfaces may be produced directly in the surfaces of the carrier 10 and of the component 23, for example by engraving.

It will be noted that the form of the wettable surfaces, and therefore of the bumps in the embodiments described, may be of any type and chosen as a function of the intended use. It will be noted in this respect, that the truncated sphere remains valid as a first calculation approximation for the equilibrium height, whatever form the wettable surfaces may take.

It will also be noted that the hybridization columns may also fulfil the conventional function of electrical interconnections between the component 22, for example a detection circuit comprising a matrix of unitary detection elements, and the carrier 10, for example a read-out circuit of the matrix of unitary detection elements.

Embodiments have been described wherein the thick and rigid component 22 or the flexible component 23 is transferred once the solder beads 18 have been shaped for the first time, as is described in relation to FIG. 3. In a second embodiment, whereof one alternative is shown in FIGS. 13 to 15, the thick and rigid component 22 is transferred directly onto the wafers of fusion material deposited on the wettability surfaces of the non-wettable carrier 10. This means in particular that different volumes can easily be used, as the need arises, for the solder beads while producing a hybridization plane.

With reference to FIG. 13, wafers of solder material 50 are deposited on the bumps 12 on the carrier 10 so as to obtain a hybridization plane 52. As a function of the volume of solder material of a wafer 50 deposited on a bump 12, the wafer 50 is able entirely to cover the bump 12, or even to drown it. The thick and rigid component 22 is then placed on the wafers 50 with no prior stage of shaping the wafers 50 by heating.

The assembly is then heated to melt the solder material of the wafers, cooled to solidify them, so that the component 22 is soldered to the component 10. The component 22 is thinned down to make it flexible (FIG. 14). Lastly, the assembly is heated to melt the different volumes of solder material which then assume their equilibrium form thereby modeling the softened flexible component 23 (FIG. 15), and then the assembly is cooled.

By means of the invention, the following advantages are thus obtained:
  direct modeling of a surface relative to a plane rigid carrier;
  production of complex surfaces using a method that uses conventional techniques, such as material deposition and material fusion;
  easy integration into conventional methods for the manufacture of microelectronics components made by "flip-chip" hybridization;
  increased repeatability of a particular surface, whatever the form thereof, given the natural propensity of a solder bead to have the same equilibrium volume at a constant environment;
  compensation for the twin-strip effect of the component once cooled. In particular, when a heterogeneous component (assembly of two plane components) is brought to a temperature different from its assembly temperature; there is a difference between two coefficients of expansion the effect of which is to curve the component. If the curvature of this component at low temperature is known, it can be minimized by modeling a component with its contrary curvature.

The invention claimed is:
1. A method for producing a non-plane element, including:
  fitting a flexible component on a carrier by means of hybridization columns, each column having a first height and including a volume of solder material formed between two surfaces wettable by said solder material added to the flexible component and to the carrier respectively, said wettable surfaces being surrounded by zones which are non-wettable by the solder material, the wettable surfaces and the volume of solder material being determined as a function of a second height required for the flexible component relative to the carrier at the place where the column is formed, such that the column varies from the first height to the second height when the volume of solder material is brought to a temperature higher than or equal to its melting point; and heating the volumes of solder material of the columns to a temperature higher than or equal to the melting point of said material in order to melt it.

2. The method for producing a non-plane element as claimed in claim 1, wherein it includes the formation of a thick and rigid component intended to become the flexible component by thinning down, and wherein fitting the flexible component onto the carrier includes:

forming the wettable surfaces of the carrier and forming the volumes of solder material on said wettable surfaces of the carrier;

forming the wettable surfaces determined for the flexible component on the thick component;

transferring the thick and rigid component onto the carrier thereby bringing the wettable surfaces and the volumes of solder material into contact so as to form the hybridization columns;

heating the volumes of solder material to a temperature higher than or equal to the melting point of said volumes, and then cooling same; and producing the flexible component by thinning down the thick and rigid component.

3. The method for producing a non-plane element as claimed in claim 1, wherein fitting the flexible component onto the carrier includes:

forming the wettable surfaces of the carrier and forming the volumes of solder material on said wettable surfaces of the carrier;

forming the wettable surfaces of the flexible component; and transferring the flexible component onto the carrier thereby bringing the wettable surfaces and the volumes of solder material into contact so as to form the hybridization columns.

4. The method for producing a non-plane element as claimed in claim 2, wherein the wettable surfaces formed on the carrier and the volumes of solder material formed on said wettable surfaces form column elements of substantially the same height so as to form a hybridization plane.

5. The method for producing a non-plane element as claimed in claim 2, wherein the volumes of solder material are deposited at least partially on the wettable surfaces formed on the carrier in the form of wafers.

6. The method for producing a non-plane element as claimed in claim 2, wherein the volumes of solder material are deposited on the wettable surfaces formed on the carrier, heated to a temperature higher than or equal to the melting point thereof so as to form solder beads on the wettable surfaces, and then cooled.

7. The method for producing a non-plane element as claimed in claim 4, wherein the wettable surfaces of the carrier have substantially the same area and are formed on elements of substantially the same height, and in that the volumes of solder material are substantially identical.

8. The method for producing a non-plane element as claimed in claim 6, wherein the wettable surfaces of the carrier have substantially the same area and are formed on elements of substantially the same height, and in that the volumes of solder material are substantially identical.

9. The method for producing a non-plane element as claimed in claim 1, wherein the solder material is indium.

10. A non-plane matrix detector produced in accordance with a method as claimed in claim 1.

11. A non-plane mirror produced in accordance with a method as claimed in claim 1.

12. A non-plane matrix detector produced in accordance with a method as claimed in claim 2.

13. A non-plane matrix detector produced in accordance with a method as claimed in claim 3.

14. A non-plane matrix detector produced in accordance with a method as claimed in claim 4.

15. A non-plane matrix detector produced in accordance with a method as claimed in claim 5.

16. A non-plane matrix detector produced in accordance with a method as claimed in claim 6.

17. A non-plane matrix detector produced in accordance with a method as claimed in claim 7.

18. A non-plane matrix detector produced in accordance with a method as claimed in claim 8.

19. A non-plane matrix detector produced in accordance with a method as claimed in claim 9.

20. A non-plane mirror produced in accordance with a method as claimed in claim 2.

21. A non-plane mirror produced in accordance with a method as claimed in claim 3.

22. A non-plane mirror produced in accordance with a method as claimed in claim 4.

23. A non-plane mirror produced in accordance with a method as claimed in claim 5.

24. A non-plane mirror produced in accordance with a method as claimed in claim 6.

25. A non-plane mirror produced in accordance with a method as claimed in claim 7.

26. A non-plane mirror produced in accordance with a method as claimed in claim 8.

* * * * *